US008828871B2

(12) United States Patent
Zhou et al.

(10) Patent No.: US 8,828,871 B2
(45) Date of Patent: Sep. 9, 2014

(54) METHOD FOR FORMING PATTERN AND MASK PATTERN, AND METHOD FOR MANUFACTURING SEMICONDUCTOR DEVICE

(75) Inventors: Junqing Zhou, Beijing (CN); Xiaoying Meng, Beijing (CN); Haiyang Zhang, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 81 days.

(21) Appl. No.: 13/293,979

(22) Filed: Nov. 10, 2011

(65) Prior Publication Data

US 2013/0059438 A1    Mar. 7, 2013

(30) Foreign Application Priority Data

Sep. 6, 2011    (CN) .......................... 2011 1 0261499

(51) Int. Cl.
*H01L 21/306* (2006.01)
*B44C 1/22* (2006.01)
*B29C 59/02* (2006.01)

(52) U.S. Cl.
USPC .......... 438/689; 216/2; 216/12; 257/E21.219; 264/293

(58) Field of Classification Search
None
See application file for complete search history.

(56) References Cited

U.S. PATENT DOCUMENTS

| | | | |
|---|---|---|---|
| 6,565,763 B1 * | 5/2003 | Asakawa et al. ................ 216/56 |
| 6,814,897 B2 * | 11/2004 | Morita ......................... 264/1.33 |
| 8,007,862 B2 * | 8/2011 | Lee et al. .................... 427/163.1 |
| 8,114,301 B2 * | 2/2012 | Millward et al. .................. 216/2 |
| 8,114,468 B2 * | 2/2012 | Sandhu et al. ................ 427/98.4 |
| 8,119,017 B2 * | 2/2012 | Albrecht et al. ................ 216/22 |
| 8,178,011 B2 * | 5/2012 | Kruglick ......................... 264/2.5 |
| 8,202,436 B2 * | 6/2012 | Lee ................................ 216/13 |
| 8,211,737 B2 * | 7/2012 | Russell et al. .................. 438/89 |
| 8,293,354 B2 * | 10/2012 | Fu et al. ......................... 428/141 |
| 8,372,295 B2 * | 2/2013 | Millward ........................... 216/2 |
| 2007/0122749 A1 * | 5/2007 | Fu et al. ......................... 430/311 |
| 2008/0257187 A1 * | 10/2008 | Millward ...................... 101/452 |

(Continued)

OTHER PUBLICATIONS

Heon Lee, et al., "Fabrication of Nanosize Patterned Substrates using Nano Imprinting Lithography" Proceedings of the $3^{rd}$ Annual International IEEE EMBS Special Topic Conference on Microtechnoloo-ies in Medicine ad Biology, Kahuka, Oahu, Hawaii u May 12-15, 2005.

(Continued)

*Primary Examiner* — Allan Olsen
(74) *Attorney, Agent, or Firm* — Koppel, Patrick, Heybl & Philpott; Michael J. Ram

(57) ABSTRACT

A pattern formation method, mask pattern formation method and a method for manufacturing semiconductor devices are provided in this disclosure, which are directed to the field of semiconductor processes. The pattern formation method comprises: providing a substrate; forming a polymer thin film containing a block copolymer on the substrate; forming a first pattern through imprinting the polymer thin film with a stamp; forming domains composed of different copolymer components through directed self assembly of the copolymer in the first pattern; selectively removing the domains composed of copolymer components to form a second pattern. In the embodiments of the present invention, finer pitch patterns can be obtained through combining the imprinting and DSA process without exposure, which as compared to the prior art methods has the advantage of simplicity. Furthermore, stamps used in imprinting may have relative larger pitches, facilitating and simplifying the manufacture and alignment of the stamps.

16 Claims, 9 Drawing Sheets

(56) References Cited

U.S. PATENT DOCUMENTS

| | | | |
|---|---|---|---|
| 2009/0004375 A1* | 1/2009 | Kim et al. | 427/163.1 |
| 2009/0196488 A1* | 8/2009 | Nealey et al. | 382/145 |
| 2009/0274887 A1* | 11/2009 | Millward et al. | 428/221 |
| 2009/0311166 A1* | 12/2009 | Hart et al. | 423/445 B |
| 2010/0075116 A1* | 3/2010 | Russell et al. | 428/195.1 |
| 2010/0316849 A1* | 12/2010 | Millward et al. | 428/195.1 |
| 2011/0042301 A1* | 2/2011 | Zhang et al. | 210/500.21 |
| 2011/0232515 A1* | 9/2011 | Millward | 101/333 |
| 2012/0041121 A1* | 2/2012 | Asakawa et al. | 524/365 |
| 2012/0107583 A1* | 5/2012 | Xiao et al. | 428/210 |
| 2012/0135159 A1* | 5/2012 | Xiao et al. | 427/534 |
| 2012/0196094 A1* | 8/2012 | Xu et al. | 428/195.1 |
| 2012/0301677 A1* | 11/2012 | Russell et al. | 428/161 |
| 2013/0059438 A1* | 3/2013 | Zhou et al. | 438/689 |

OTHER PUBLICATIONS

Invention Disclosure Application Form from Semiconductor Manufacturing International Corp., 8 pages.

Invention Disclosure Semiconductor Manufacturing International Corporation, 9 pages.

\* cited by examiner

METHOD FOR FORMING PATTERN AND MASK PATTERN, AND METHOD FOR MANUFACTURING SEMICONDUCTOR DEVICE

CROSS-REFERENCE TO RELATED APPLICATIONS

This application claims priority to Chinese Patent Application No. 201110261499.8, filed on Sep. 6, 2011 and entitled "Method for forming pattern and mask pattern, and method for manufacturing semiconductor device", which is incorporated herein by reference in its entirety.

BACKGROUND OF THE INVENTION

1. Field of the Invention

The present invention relates to the field of semiconductor processes, and particularly to methods for forming patterns and mask patterns and a method for manufacturing a semiconductor device.

2. Description of the Related Art

With the scaling down of technical processes, it is hard to get finer pitch patterns with current lithography, and double patterning is one of potential schemes with feasibility. Current double patterning techniques focus on LELE (Litho-Etch-Litho-Etch), LFLE (Litho-Freeze-Litho-Etch) and sidewall spacers.

However, with conventional lithography, it is difficult to provide pattern dimensions less than 22 nm, even for expensive and complex double patterning methods.

DSA (Directed self-assembly) techniques have been widely concerned as a possible solution for the problem of forming smaller pitch patterns, in which a block copolymer (BCP) or polymer compounds is deposited on a substrate through, generally, spin coating, and is "directed" to form ordered structures through annealing. DSA is capable of producing small pitch patterns. Under appropriate conditions, blocks of such copolymer phases are separated into micro domains (also called "domains"), during which nanoscale features are formed for different chemical combinations. The capability of forming such kind of features makes block copolymers suitable for nano-patterning and achieving features with smaller characteristic dimensions (CD), and thus capable of constructing features that are difficult to be obtained through conventional lithography.

As a potentially alternative scheme, DSA can improve the resolution limitation of current lithography through producing self assembled nanoscale domains on a substrate, which is provided with existing patterns defined through lithography thereon. This method may control the spatial alignment of a specific self assembled BCP domain through combining the aspects of self assembly and a lithographically defined substrate.

One DSA process is graphoepitaxy, in which self assembly is guided by topographical features of a lithographically pre-patterned substrate. Graphoepitaxy may provide sub-lithographic, self-assembled features having a smaller characteristic dimension than that of pre-patterned features themselves.

FIG. 1A to FIG. 1E schematically show a prior art pattern formation flow of a self-assembly block copolymer through graphoepitaxy.

As shown in FIG. 1A, positive photoresist 113 is exposed through a mask 114, wherein an ARC (Anti-reflection coating)/PS (polystyrene) brush layer 112 and a photoresist layer 113 are formed in sequence on a substrate 111.

As shown in FIG. 1B, after exposing photoresist 113, the exposed areas of photoresist 113 are removed in a developer to expose the brush layer 112 under the photoresist layer.

As shown in FIG. 1C, a polymer thin film 115 containing a block copolymer is coated on the exposed brush layer 112.

As shown in FIG. 1D, domains 116 and 117 composed of different components are formed through the block copolymer's directed self assembly in the polymer thin film 115.

As shown in FIG. 1E, for example, the domain 117 is selectively removed to form a pattern constituted of the domain 116.

Another DSA technique is surface chemical patterning. FIGS. 2A to 2G schematically show a prior art pattern formation flow of a self-assembly block copolymer through surface chemical patterning.

As shown in FIG. 2A, positive photoresist 213 is exposed through a mask 214, wherein an ARC/PS brush layer 212 and a photoresist layer 213 are formed in sequence on a substrate 211.

As shown in FIG. 2B, after exposing photoresist 213, a patterned photoresist layer 213 is formed to expose the brush layer 112 under the photoresist layer.

As shown in FIG. 2C, the exposed brush layer 212 is oxidized to get an oxygenated brush layer 215.

As shown in FIG. 2D, the photoresist layer 213 is removed to expose the patterned brush layer 212.

As shown in FIG. 2E, a polymer thin film 216 containing a block copolymer is coated on the patterned brush layer 212.

As shown in FIG. 2F, the patterned brush layer 212 is employed as a mask to control the directed self assembly of the block copolymer in the polymer thin film 216, so as to form domains 217 and 218 of different components.

As shown in FIG. 2G, for example, the domain 217 is selectively removed to form a pattern constituted of the domain 218.

However, exposure is generally necessary in all DSA techniques in the prior art, in which mask construction and the like are required, resulting in consequential complexity and high cost.

SUMMARY OF THE INVENTION

The present invention is proposed in view of the above problems.

An object of the present invention is to provide a pattern forming method capable of forming finer pitch patterns with simple processes.

According to a first aspect of the present invention, there is provided a method for forming patterns, which may comprise: providing a substrate; forming a polymer thin film containing a block copolymer on the substrate, wherein the components of the block copolymer are immiscible with each other; forming a first pattern through imprinting the polymer thin film with a stamp; forming domains composed of different copolymer components, respectively, through directed self assembly of the copolymer in the first pattern; selectively removing a domain composed of a copolymer component to form a second pattern.

Preferably, the block copolymer is a biblock copolymer.

Preferably, the block copolymer is selected from a group consisting of the following substances: poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl(meth)acrylate), poly(methyl methacrylate-b-t-butyl methacrylate), poly(ethylene oxide-b-propylene oxide), poly(styrene-b-tetrahydrofuran), and combinations of the foregoing block copolymers.

Preferably, the substrate comprises a mask layer under the polymer thin film containing the block copolymer.

Preferably, the mask layer comprises at least one of polymer, metal, oxide, nitride and carbon-type materials.

Preferably, a brush layer and the polymer thin film containing a block copolymer are formed in sequence on the mask layer.

Preferably, the domain composed of a copolymer component is selectively removed through dry etching or wet etching.

Preferably, the block copolymer is PS-b-PMMA; and selectively removing the domain composed of a copolymer component to form a second pattern comprises: selectively removing the domain composed of PMMA to form the second pattern.

Preferably, selectively removing the domain composed of PMMA to form the second pattern comprises selectively removing the domain composed of PMMA to form the second pattern through wet etching.

Preferably, the imprinting is nano-imprinting.

Preferably, the nano-imprinting is hot embossing lithography (HEL), UV-nanoimprinting (UV-NIL), step-flash-nanoimprinting (S-FIL), or microcontact printing (μCP).

Preferably, the stamp is formed of Si, SiO$_2$, silicon nitride, or diamond materials.

Preferably, the directed self assembly of the copolymer in the first pattern is performed through molecular interaction.

Preferably, performing the directed self assembly of the copolymer in the first pattern through molecular interaction comprises: performing the directed self assembly of the copolymer in the first pattern according to a template through a redox mechanism; or performing the directed self assembly of the copolymer in the first pattern according to a template in a solvent; or performing the directed self assembly of the copolymer in the first pattern under a certain pH and metal ion condition; or performing temperature induced denaturation of DNA strains under a temperature condition of the copolymer in the first pattern; or performing photoisomerization by the copolymer in the first pattern under a certain light condition.

Preferably, the directed self assembly of the copolymer in the first pattern is performed through an external field, wherein the external field comprises an electric field, magnetic field, flow field, liquid interface, or a combination of the above fields.

According to the patterning method of one aspect of the present invention, finer pitch patterns can be obtained with simple processes through combining the imprinting technique and DSA process.

According to another aspect of the present invention, there is provided a mask patterning method, which may comprise: forming a second pattern of a polymer thin film using the above patterning method; etching the mask layer with the second pattern to form a mask pattern.

According to still another aspect of the present invention, there is provided a manufacturing method of a semiconductor device, which may comprise: etching a semiconductor layer formed on a substrate using a mask having the above mask pattern so as to pattern the semiconductor layer.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention can be more clearly understood from the following detailed description with reference of accompanying drawings, wherein.

DESCRIPTION OF THE EMBODIMENTS

Figure 1A:
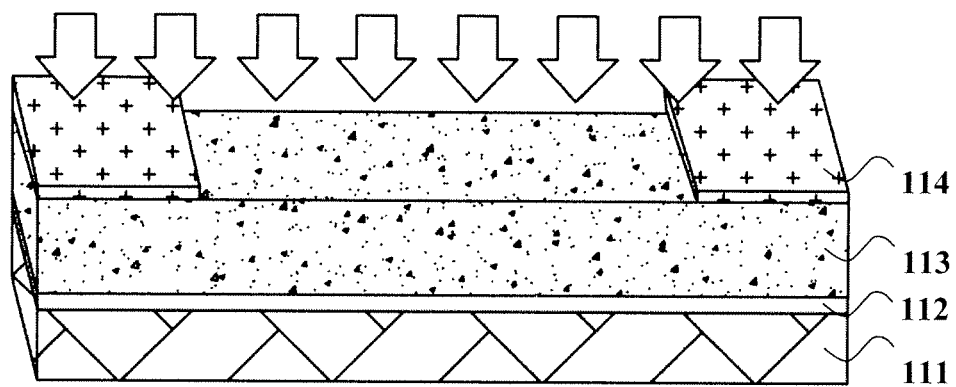
FIGS. 1A to 1E schematically show a pattern formation flow of self-assembly block copolymer through graphoepitaxy in the prior art.
Figure 1B:
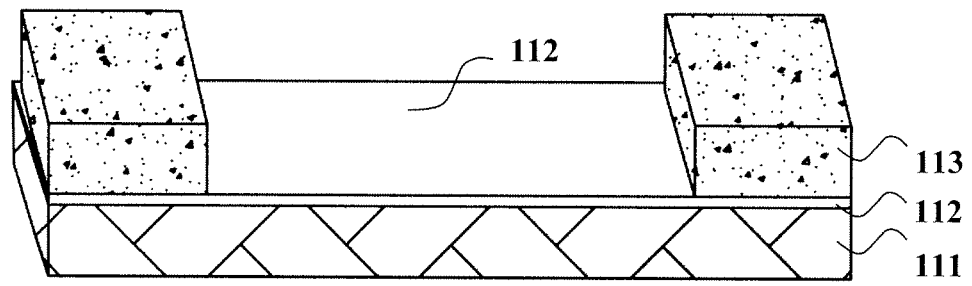
Figure 1C:
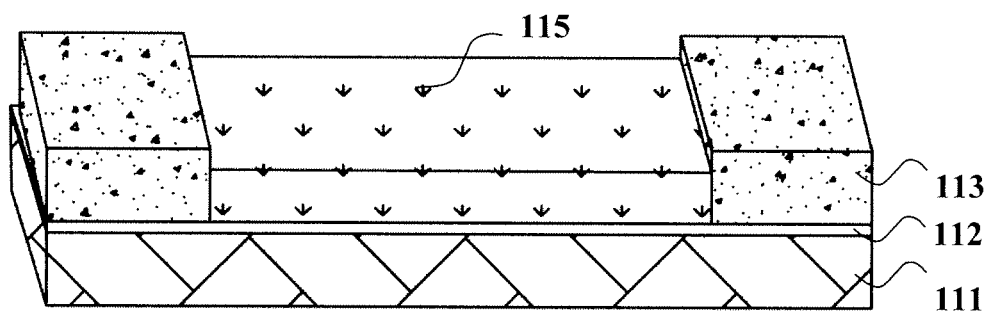
Figure 1D:
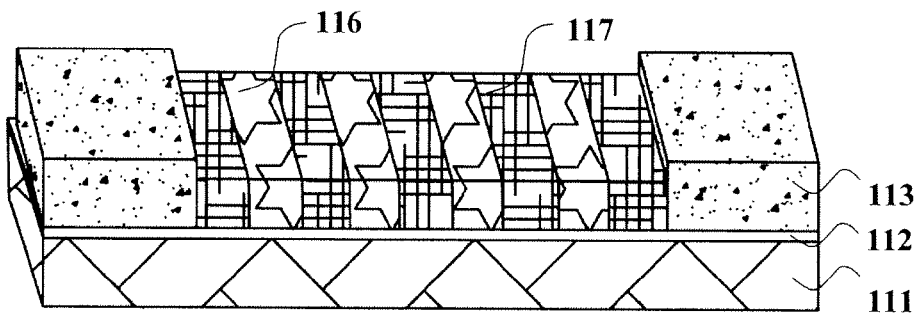
Figure 1E:
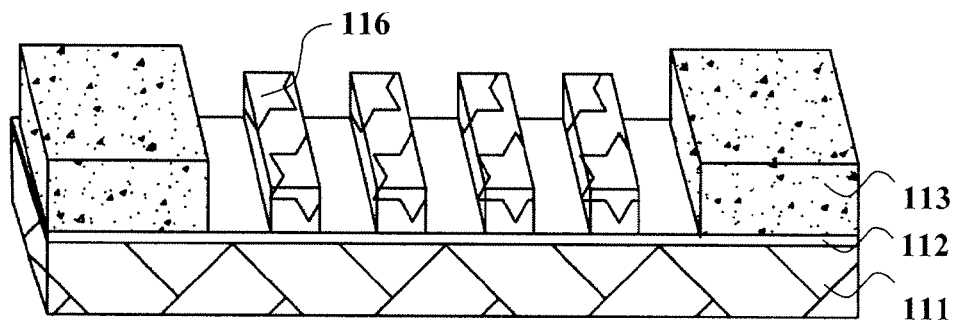
Figure 2A:
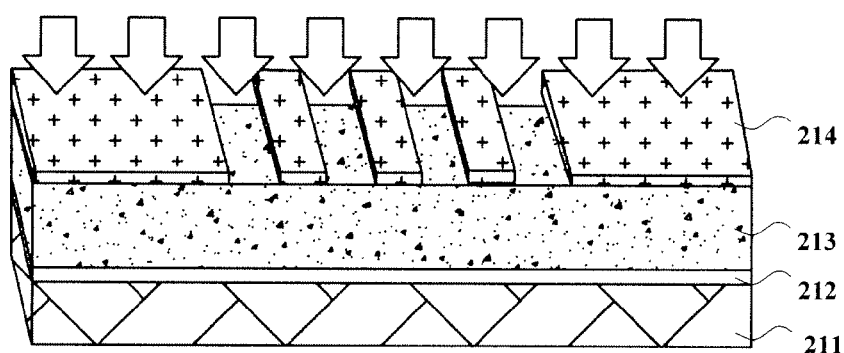
FIGS. 2A to 2G schematically show a pattern formation flow of self-assembly block copolymer through surface chemical pattern in the prior art.
Figure 2B:
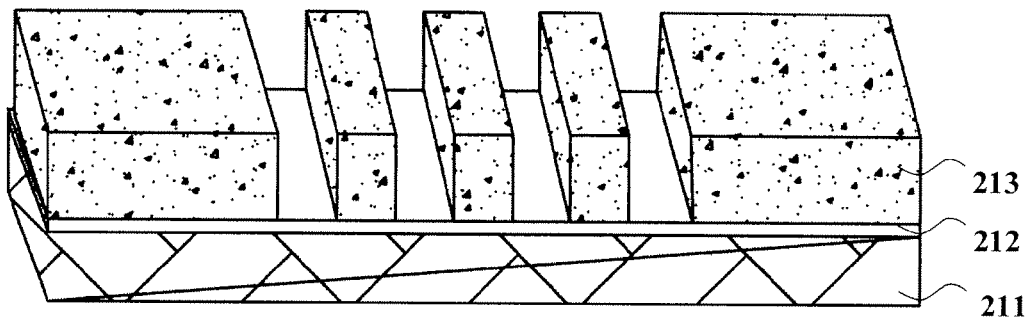
Figure 2C:
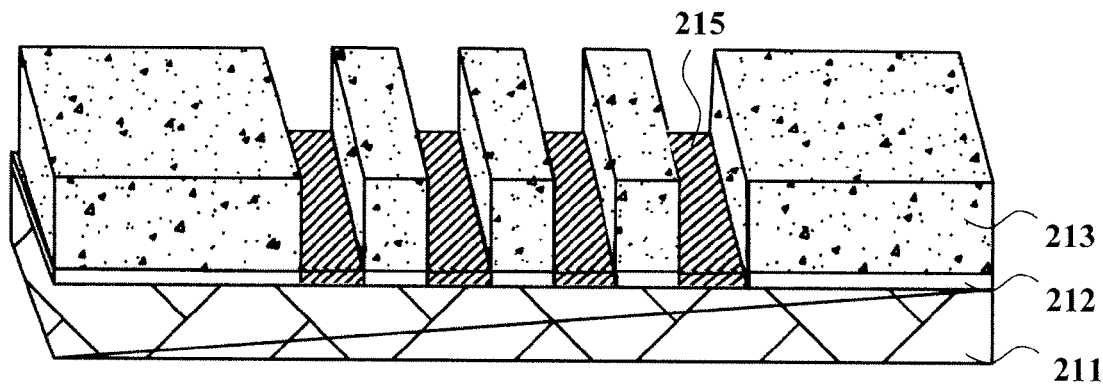
Figure 2D:
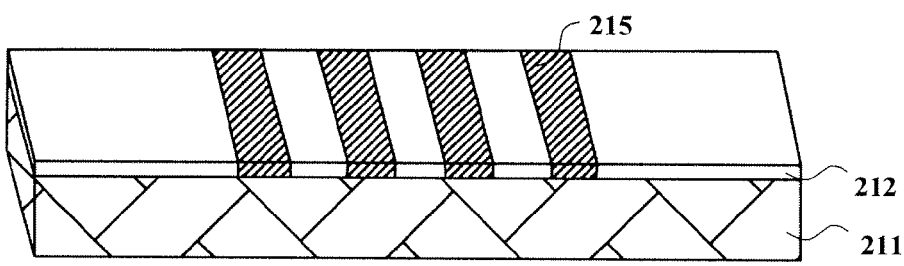
Figure 2E:
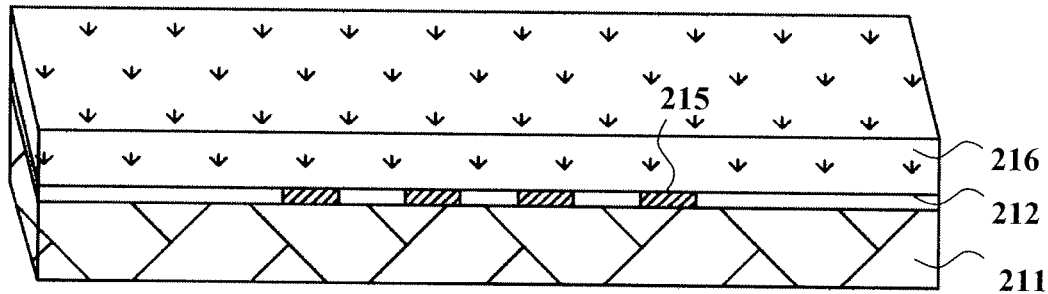
Figure 2F:
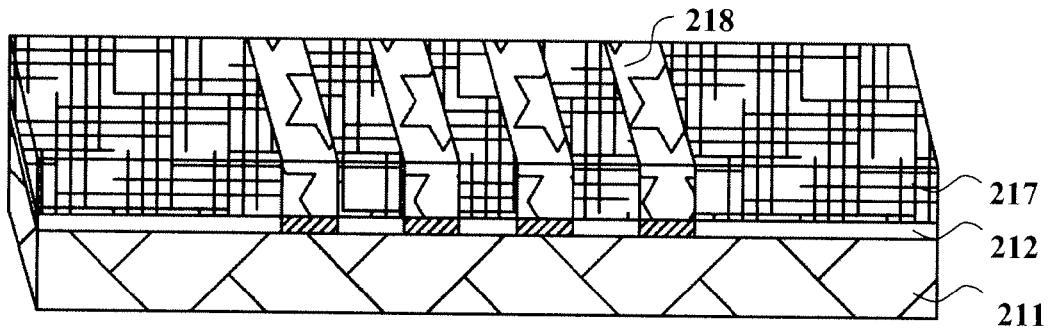
Figure 2G:
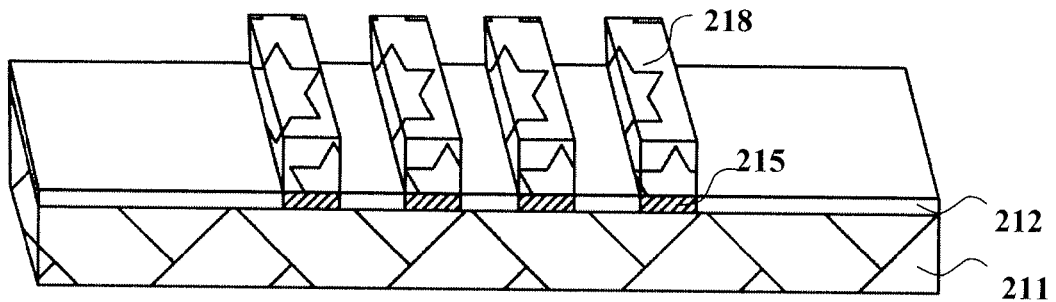

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

At the same time, it should be appreciated that for the simplicity of description, each part in these figures may not be drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Below, a method for manufacturing semiconductor devices according to the present invention will be described with reference to the sectional views of various steps shown in FIGS. 3A to 3F and FIG. 4A to FIG. 4H.

FIGS. 3A to 3F schematically show sectional views of various steps of a semiconductor device manufacturing method according to a first embodiment of this invention.

Figure 3A:
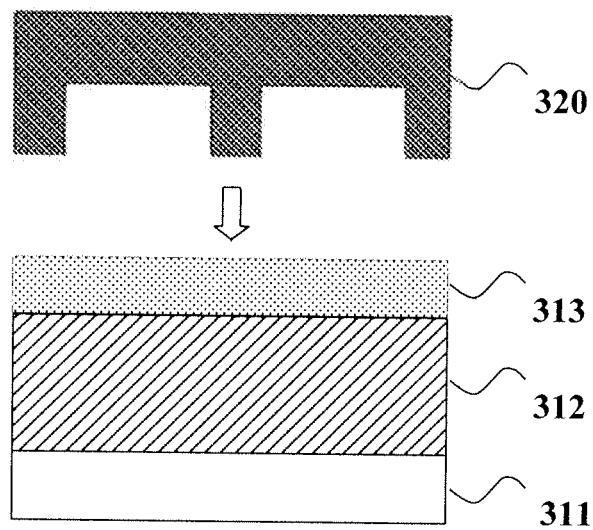
FIGS. 3A to 3F schematically show sectional views of various steps of a semiconductor device manufacturing method according to a first embodiment of this invention.

As shown in FIG. 3A, a substrate 311 is provided, a polymer thin film 313 containing a block copolymer is formed on the substrate 311, and the components of the copolymer are immiscible with each other. The block copolymer can be biblock copolymer, such as PS-b-PMMA (poly(styrene-b-methyl methacrylate)). In one embodiment, the substrate 311 comprises a mask layer 312 disposed under the polymer thin film 313. The label 320 represents a stamp, which is formed of, for example, Si, $SiO_2$, silicon nitride, or diamond materials.

Figure 3B:
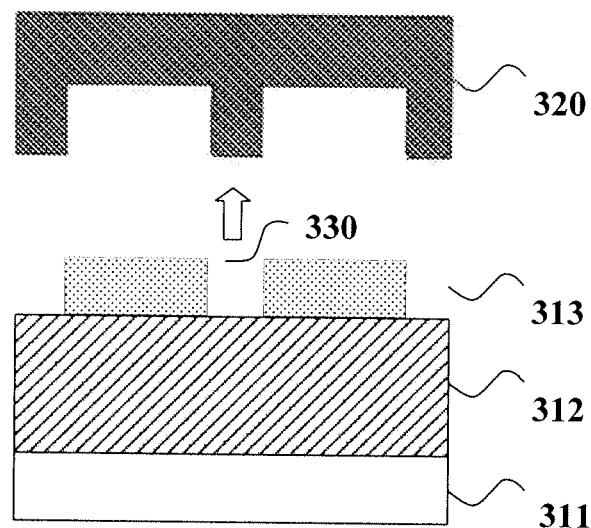

As shown in FIG. 3B, a first pattern 330 of the polymer thin film 313 is formed through imprinting the polymer thin film 313 with the stamp 320.

Figure 3C:
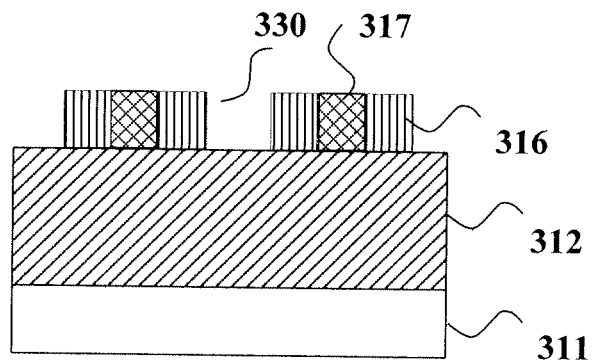

As shown in FIG. 3C, domains composed of different copolymer components, for example, domains 316 and 317 are formed respectively through directed self assembly of the copolymer in the first pattern 330. In one embodiment, domains 316 and 317 correspond to domains composed of PS and PMMA, respectively.

Figure 3D:
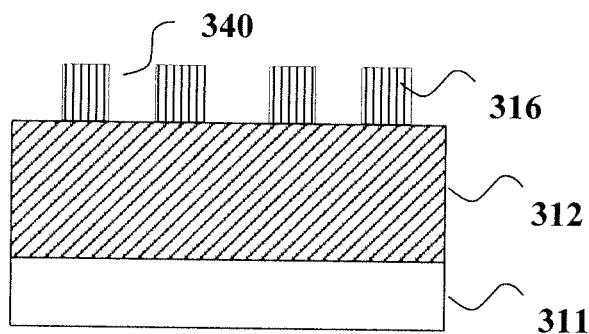

As shown in FIG. 3D, for example, the domain 317 composed of a copolymer component is selectively removed through dry etching or wet etching to form a second pattern 340. In one embodiment, the domain 317 composed of PMMA is removed through dry etching, and a second pattern 340 is constructed by the domain 316 composed of PS.

In the above embodiment, through combining imprinting and DSA processes, finer pitch patterns can be obtained without exposure, which as compared to the methods of the prior art has the advantage of simplicity. Furthermore, stamps used in imprinting may have relative larger pitches, facilitating and simplifying the manufacture and alignment of the stamps.

Figure 3E:
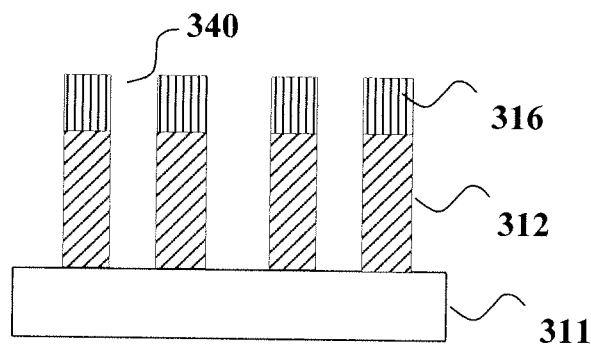

After forming the second pattern, it can be transferred to the substrate. The method may further comprise:

As shown in FIG. 3E, the second pattern 340 is transferred to the mask layer 312 through etching. The mask layer may comprise at least one of copolymer, metal, oxide, nitride and carbon-type materials.

Figure 3F:
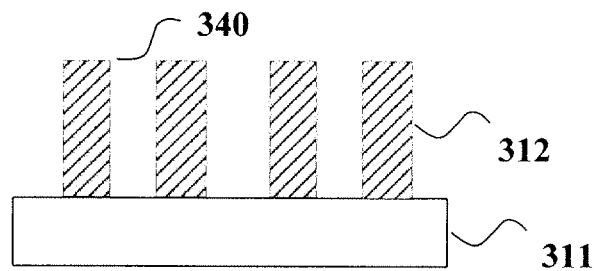

As shown in FIG. 3F, the domain 316 composed of a copolymer component on the mask 312 is removed.

Semiconductor fabrication processes can be better controlled through transferring patterns to the mask layer, and etching the semiconductor material with the patterned mask layer to form semiconductor devices.

Note that the block copolymer of embodiments of the present invention can be selected from a group consisting of the following substances: poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), and combinations of the foregoing block copolymers.

FIGS. 4A to 4H schematically show sectional views of various steps of a semiconductor device manufacturing method according to a second embodiment of this invention.

Figure 4A:
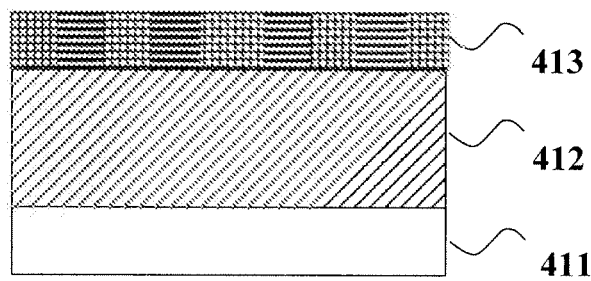
FIGS. 4A to 4H schematically show sectional views of various steps of a semiconductor device manufacturing method according to a second embodiment of this invention.

As shown in FIG. 4A, a substrate 411 is provided, with a mask layer 412 on the substrate 411, and a brush layer 413 formed on the mask layer 412. The brush layer 413, for example, is an oxygenated brush layer, and is used as a DSA template later. The brush layer can be formed through state-in-art or other methods.

Figure 4B:
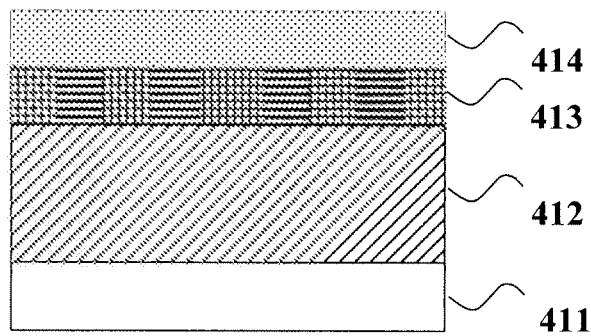

As shown in FIG. 4B, a polymer thin film 414 containing a block copolymer is formed on the brush layer 413, wherein the block copolymer is, for example, PS-b-PMMA.

Figure 4C:
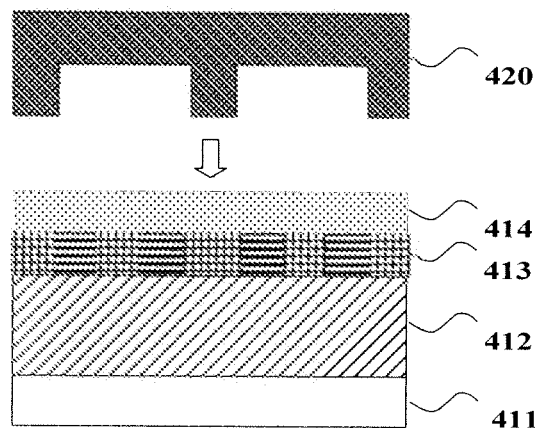

As shown in FIG. 4C, the polymer thin film 414 is nano-imprinted with a nano-stamp 420.

Figure 4D:
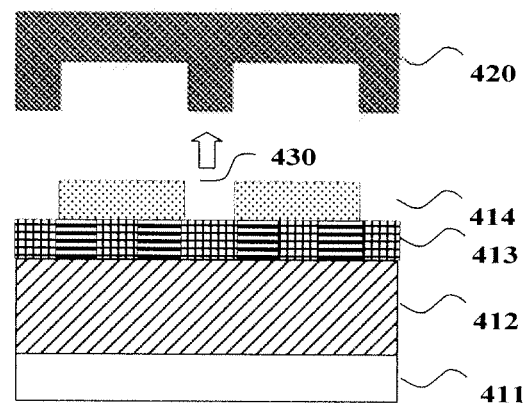

As shown in FIG. 4D, a first pattern 430 is formed on the polymer thin film 414 through imprinting.

Figure 4E:
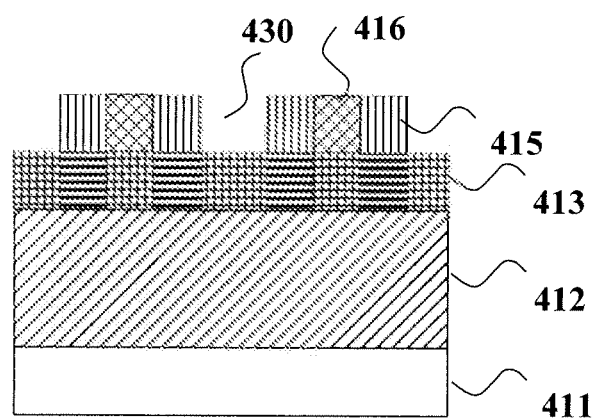

As shown in FIG. 4E, using the brush layer 413 as a template, domains 415 and 416 composed of different copolymer components such as PS and PMMA are formed respectively through self assembling.

Figure 4F:
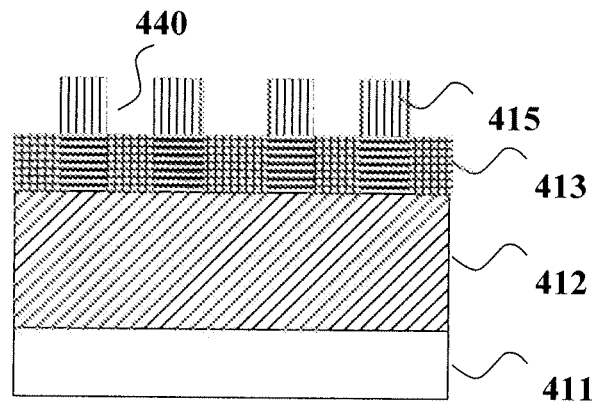

As shown in FIG. 4F, the domain 416 composed of PMMA is selectively removed through wet etching, to form a second pattern 440 constituted of the domain 415 which is composed of PS.

Figure 4G:
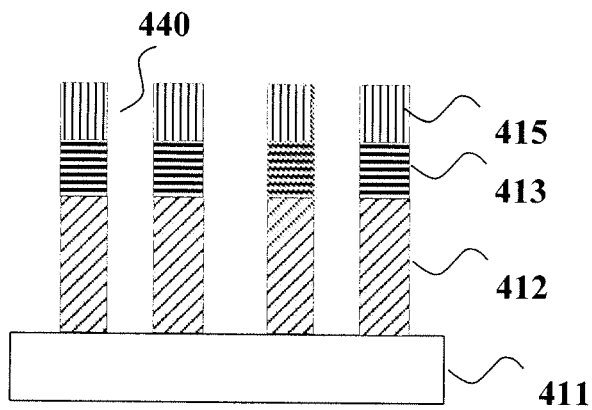

As shown in FIG. 4G, the brush layer 413 and mask layer 412 are etched according to the second pattern 440 to transfer the second pattern 440 to the mask layer 412.

Figure 4H:
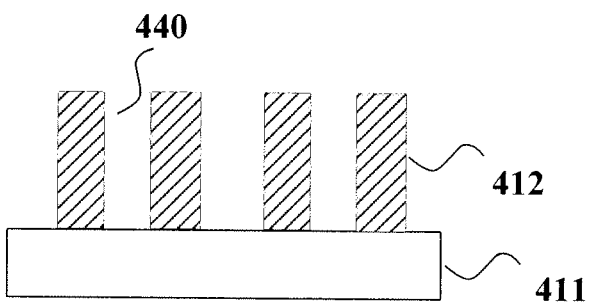

As shown in FIG. 4H, the remaining portions of the polymer thin film 415 and brush layer 413 are removed through dry etching.

In the above embodiments, expected patterns can be obtained in a better manner through controlling the DSA of the polymer layer using the brush layer as a template.

Note that although only two domains composed of different copolymer components are illustrated in the embodiments of FIGS. 3A-3F and FIGS. 4A-4H. It should be appreciated by those skilled in the art that embodiments of the present invention are not limited to two domains. Patterns shown in FIGS. 3A-3F and FIGS. 4A-4H are merely illustrative and it is possible to form different first and second patterns as required.

It should be appreciated by those skilled in the art that the directed self assembly of the copolymer in the first pattern can be performed through molecular interaction. For example, the directed self assembly of the copolymer in the first pattern can be performed according to a template in a reductant-oxidant; the directed self assembly of the copolymer in the first pattern can be performed according to a template in a solvent; or the directed self assembly of the copolymer in the first pattern can be performed under a certain pH and metal ion condition; or temperature induced denaturation of DNA strains can be taken place by the copolymer in the first pattern under a certain temperature condition; or photoisomerization can be taken place by the copolymer in the first pattern under a certain light condition. Besides, the directed self assembly of the copolymer in the first pattern can be performed in an external field, which may comprise an electric field, magnetic field, flow field, liquid interface, or a combination of above fields.

In the embodiments of the present invention, the nano-imprinting is hot embossing lithography (HEL), UV-nanoimprinting (UV-NIL), step-flash-nanoimprinting (S-FIL), or microcontact printing (μCP).

Thus, the method for manufacturing a semiconductor device as well as semiconductor devices formed by such a method have been described in detail according to this invention. Some details that are well known in the art are not discussed for the purpose of not obscuring the concept of this invention. With the above description, those skilled in the art can thoroughly understand how to implement the technique solutions disclosed herein.

The semiconductor device and method of the present invention can be implemented in many manners. The above mentioned order for the steps of the method is merely illustrative and those steps are not limited to such specific order, unless it is otherwise specified.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable those of ordinary skill in the art to understand the invention for various embodiments with various modifications as are suited to the particular use contemplated.

What is claimed is:

1. A method for forming patterns, characterized by comprising:
   providing a substrate, with a mask layer on the substrate, and a brush layer formed on the mask layer;
   forming a polymer thin film containing components of a block copolymer on the brush layer, wherein the components of the block copolymer are immiscible with each other;
   forming a first pattern through imprinting the polymer thin film with a stamp;
   forming domains composed of different copolymer components, respectively, through directed self assembly of the copolymer in the first pattern;
   selectively removing a domain composed of a copolymer component to form a second pattern.

2. The method according to claim 1, characterized in that the block copolymer is a biblock copolymer.

3. The method according to claim 1, characterized in that the block copolymer is selected from a group consisting of the following substances: poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), and combinations of the foregoing block copolymers.

4. The method according to claim 1, characterized in that the mask layer comprises at least one of copolymer, metal, oxide, nitride and carbon-type materials.

5. The method according to claim 1, characterized in that the domain composed of a copolymer component is selectively removed through dry etching or wet etching.

6. The method according to claim 1, characterized in that the block copolymer is poly (styrene-b-methyl methacrylate) (PS-b-PMMA); and
   selectively removing the domain composed of the copolymer component to form a second pattern comprises:
   selectively removing the domain composed of PMMA to form the second pattern.

7. The method according to claim 6, characterized in that selectively removing the domain composed of PMMA to form the second pattern comprises:
   selectively removing the domain composed of PMMA to form the second pattern through wet etching.

8. The method according to claim 1, characterized in that the imprinting is nano-imprinting.

9. The method according to claim 8, characterized in that the nano-imprinting is hot embossing lithography (HEL), UV-nanoimprinting (UV-NIL), step-flash-nanoimprinting (S-FIL), or microcontact printing (μCP).

10. The method according to claim 1, characterized in that the stamp is formed of Si, $SiO_2$, silicon nitride, or diamond materials.

11. The method according to claim 1, characterized in that the directed self assembly of the copolymer in the first pattern is performed through molecular interaction.

12. The method according to claim 11, characterized in that performing the directed self assembly of the copolymer in the first pattern through molecular interaction comprises:
    performing the directed self assembly of the copolymer in the first pattern according to a template through redox mechanism; or
    performing the directed self assembly of the copolymer in the first pattern according to a template in a solvent; or
    performing the directed self assembly of the copolymer in the first pattern under a certain pH and metal ion condition; or
    performing temperature induced denaturation of DNA strains under a temperature condition by the copolymer in the first pattern; or
    performing photoisomerization by the copolymer in the first pattern under a light condition.

13. The method according to claim 1, characterized in that the directed self assembly of the copolymer in the first pattern is performed through an external field.

14. The method according to claim 13, characterized in that the external field comprises: electric field, magnetic field, flow field, liquid interface, or a combination of the above fields.

15. A mask patterning method, comprising:
    providing a substrate, with a mask layer on the substrate, and a brush layer formed on the mask layer;
    forming a polymer thin film containing components of a block copolymer on the brush layer, wherein the components of the block copolymer are immiscible with each other;
    forming a first pattern through imprinting the polymer thin film with a stamp;
    forming domains composed of different copolymer components, respectively, through directed self assembly of the copolymer in the first pattern;
    selectively removing a domain composed of a copolymer component to form a second pattern; and
    etching the mask layer using an etchant and said second pattern to form a mask pattern.

16. A manufacturing method of a semiconductor device, comprising;
    providing a substrate, with a mask layer on the substrate, and a brush layer formed on the mask layer;
    forming a polymer thin film containing components of a block copolymer on the brush layer, wherein the components of the block copolymer are immiscible with each other;
    forming a first pattern through imprinting the polymer thin film with a stamp;
    forming domains composed of different copolymer components, respectively, through directed self assembly of the copolymer in the first pattern;
    selectively removing a domain composed of a copolymer component to form a second pattern;
    etching the mask layer using an etchant and said second pattern to form a mask pattern; and
    etching a semiconductor layer on a substrate using said mask pattern, so as to pattern the semiconductor layer.

* * * * *